US006994595B2

(12) United States Patent
Baker et al.

(10) Patent No.: US 6,994,595 B2
(45) Date of Patent: Feb. 7, 2006

(54) FINGER PROOF, KEYED POWER CONNECTOR AND METHODS THEREOF

(75) Inventors: Craig Baker, Shrewsbury, MA (US); Andre Beaupre, Barre, MA (US); Greg Norton, Marlboro, MA (US); Joe Belrose, Blackstone, MA (US)

(73) Assignee: Anderson Power Products, Sterling, MA (US)

( * ) Notice: Subject to any disclaimer, the term of this patent is extended or adjusted under 35 U.S.C. 154(b) by 0 days.

(21) Appl. No.: 10/723,615

(22) Filed: Nov. 26, 2003

(65) Prior Publication Data

US 2004/0171309 A1 Sep. 2, 2004

Related U.S. Application Data

(60) Provisional application No. 60/429,977, filed on Nov. 27, 2002.

(51) Int. Cl.
*H01R 13/64* (2006.01)

(52) U.S. Cl. .................................................... 439/680

(58) Field of Classification Search ................ 439/680, 439/295, 284, 350, 171, 681, 247, 560
See application file for complete search history.

(56) References Cited

U.S. PATENT DOCUMENTS

| | | | | |
|---|---|---|---|---|
| 3,654,586 | A * | 4/1972 | Winkler | 439/295 |
| 4,695,112 | A * | 9/1987 | Maston et al. | 439/350 |
| 4,915,641 | A * | 4/1990 | Miskin et al. | 439/247 |
| 4,990,099 | A * | 2/1991 | Marin et al. | 439/284 |
| 5,167,542 | A * | 12/1992 | Haitmanek | 439/681 |
| 6,089,898 | A * | 7/2000 | Lincoln et al. | 439/357 |
| 6,383,032 | B1 * | 5/2002 | Gerberding | 439/681 |

* cited by examiner

*Primary Examiner*—Gary Paumen
*Assistant Examiner*—Phuongchi Nguyen
(74) *Attorney, Agent, or Firm*—Nixon Peabody LLP

(57) ABSTRACT

A finger proof, keyed connector includes a housing, one or more interface passages formed in the housing, one or more connector passages formed in the housing, and an electrical contact. Each of the interface passages has an outer perimeter where at least one portion of the outer perimeter is spaced in or spaced out from at least one adjacent portion of the outer perimeter. Each of the connector passages is connected to one of the interface passages. The electrical contact is seated in each of the one or more interface passages, is spaced from an opening to each of the interface passages, and extends in to the connector passage.

22 Claims, 9 Drawing Sheets

FINGER PROOF, KEYED POWER CONNECTOR AND METHODS THEREOF

This application claims the benefit of U.S. Provisional Patent Application Ser. No. 60/429,977 filed Nov. 27, 2002 which is herein incorporated by reference in its entirety.

FIELD OF THE INVENTION

This invention generally relates to connectors and, more particularly, to a finger proof, keyed power connector

BACKGROUND

Systems often need different high voltage power supplies, e.g. 24 volt, 48 volt, 96 volt, or 192 volt power supplies, coupled to different inputs to various components, such as parts, modules, and circuits, in these systems. Unfortunately, one problem which can occur is having one of these high voltage power supplies coupled to the wrong component. When this type of mistake occurs, the damage to the component and system can be severe.

SUMMARY

A finger proof, keyed connector in accordance with embodiments of the present invention includes a housing, one or more interface passages formed in the housing, one or more connector passages formed in the housing, and an electrical contact. Each of the interface passages has an outer perimeter where at least one portion of the outer perimeter is spaced in or spaced out from at least one adjacent portion of the outer perimeter. Each of the connector passages is connected to one of the interface passages. The electrical contact is seated in each of the one or more interface passages, is spaced from an opening to each of the interface passages, and extends in to the connector passage.

A method for making a finger proof, keyed connector includes forming one or more interface passages in a housing. Each of the interface passages has an outer perimeter where at least one portion of the outer perimeter is spaced in or spaced out from at least one adjacent portion of the outer perimeter. One or more connector passages are formed in the housing and each of the connector passages is connected to one of the interface passages. An electrical contact is provided in each of the one or more interface passages, is spaced from an opening to each of the interface passages, and extends in to the connector passage.

The present invention provides a power connector with a keyed configuration to assure the proper connection of a particular power source to a particular component. With the power connector, a large number of combinations are available for voltage, circuit, or application specific keying. Additionally, the power connector has hot plugging capability which helps to minimize downtime of electric and electronic equipment. Further, the present invention provides a power connector with a safer finger proof design, a smaller size when compared to prior plugs to overcome space constraints, and a low insertion and extraction force for easy plugging and unplugging of power to components.

DETAILED DESCRIPTION

A finger proof, keyed power connector 10(1) in accordance with embodiments of the present invention is illustrated in FIGS. 1–7. The power connector 10(1) includes a housing 12, a pair of connector passages 14(1) and 14(2), a pair of wiping, electrical contacts 16(1) and 16(2), a pair of interface passages 18(1) and 18(2), and a pair of mating interfaces 19(1) and 19(2), although other numbers and types of components in other configurations can be used. The present invention provides power connectors with a keyed configuration to assure the proper connection of a particular power source to a particular component and also with a safer finger proof design Referring to FIGS. 1–7, the housing 12 has four side walls 20(1)–20(4) and a substantially rectangular shape, although the housing 12 could have other numbers of side walls and other shapes. In this particular embodiment, the housing 12 has overall dimensions 2.20 W×1.42 W×0.65 H allowing it to be used on high density assemblies when space is at the premium, although the housing can have other dimensions for other applications.

A pair of mounting holes 22(1) and 22(2) extend through a pair of the opposing side walls 20(1) and 20(3) in the housing and are used with a pair of fasteners (not shown), such as screws or bolts, to mount the power connector 10, although other numbers of mounting holes and other ways for securing the connector can be used. The housing 12 also can be wire or panel mountable, as well as stackable, using the two mounting holes 22(1) and 22(2).

Figure 1:
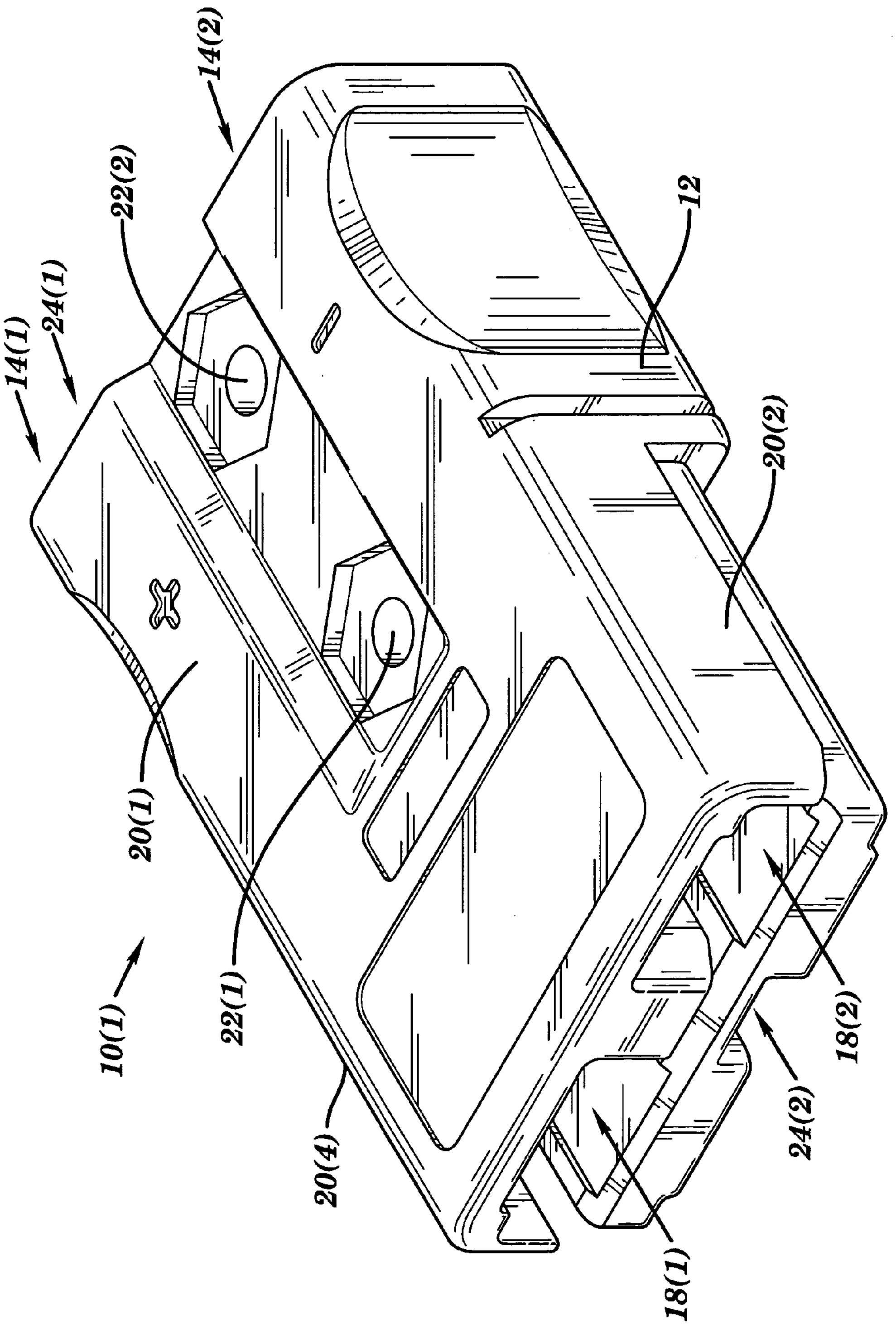
FIG. 1 is a perspective view of a first embodiment of a finger proof, keyed power connector.
Figure 2:
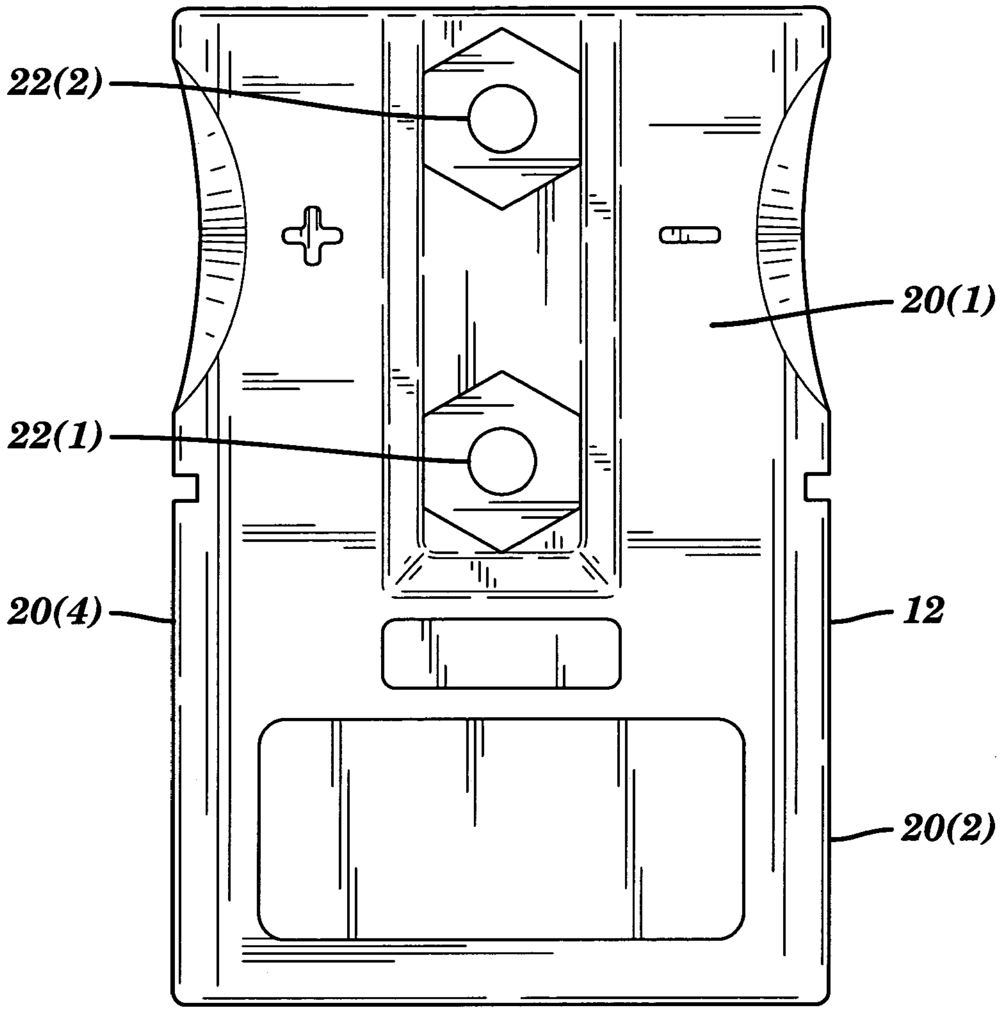
FIG. 2 is a top view of the first embodiment of the finger proof, keyed power connector.
Figure 3:
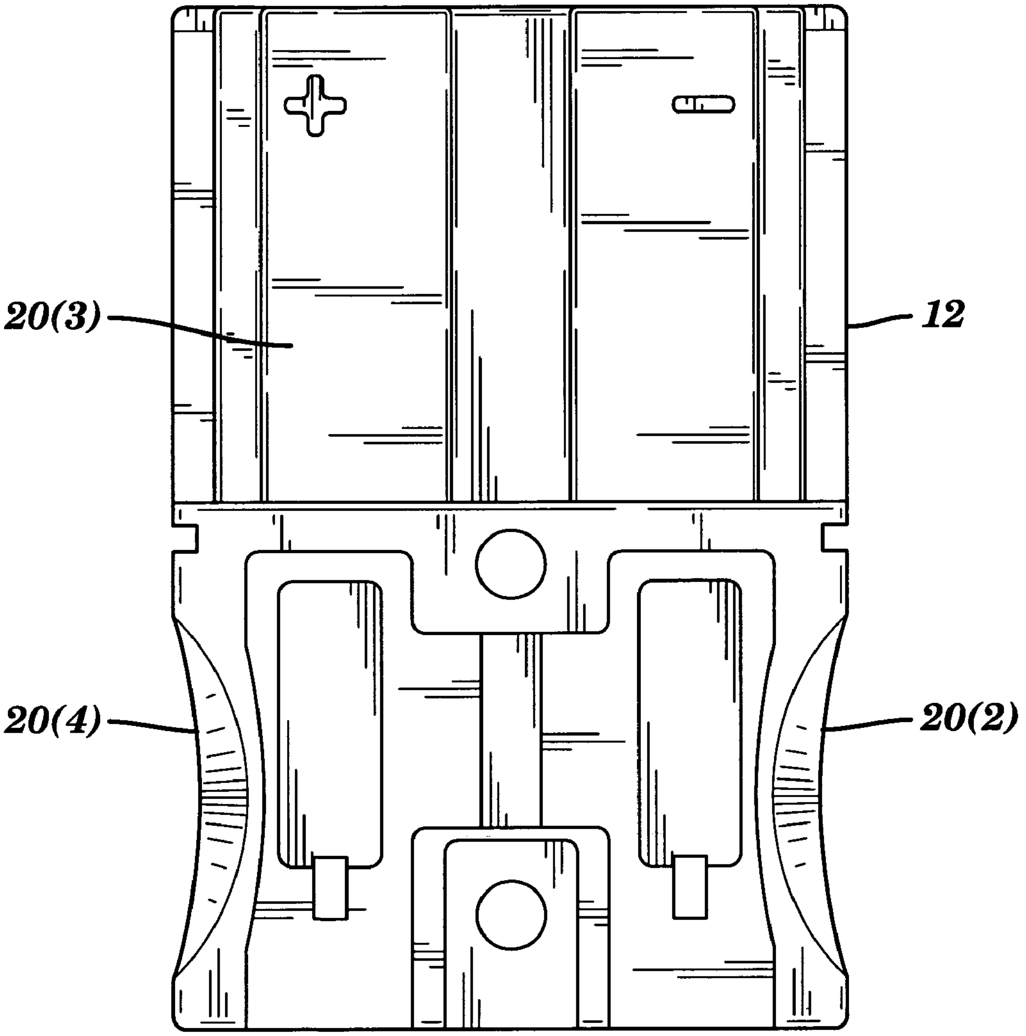
FIG. 3 is a bottom view of the first embodiment of the finger proof, keyed power connector.
Figure 4:
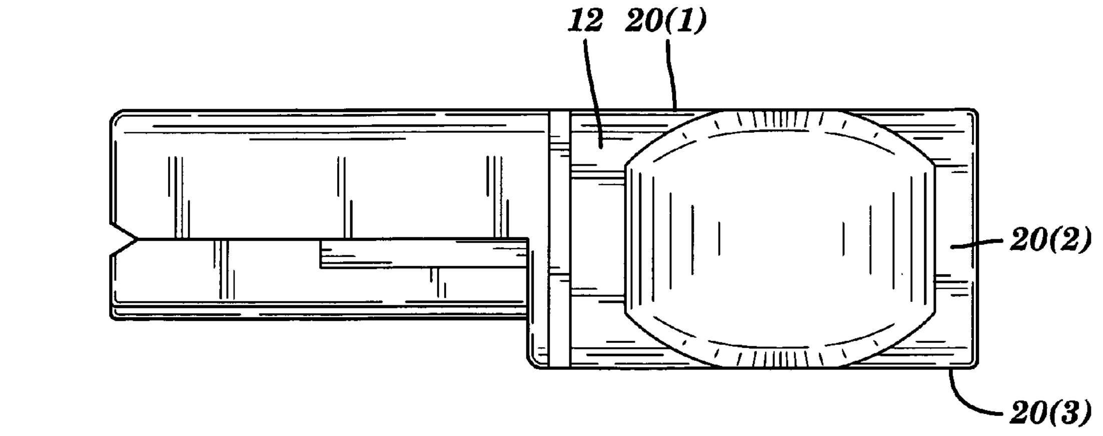
FIG. 4 is a right side view of the first embodiment of the finger proof, keyed power connector.
Figure 5:
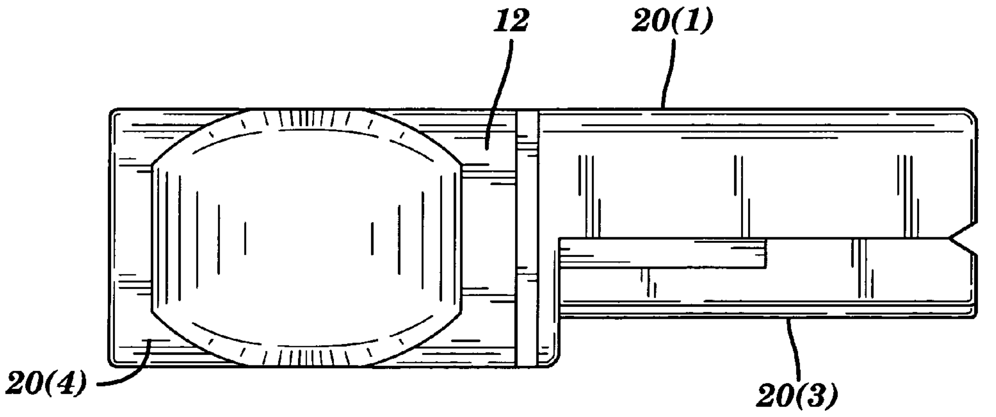
FIG. 5 is a left side view of the first embodiment of the finger proof, keyed power connector.
Figure 6:
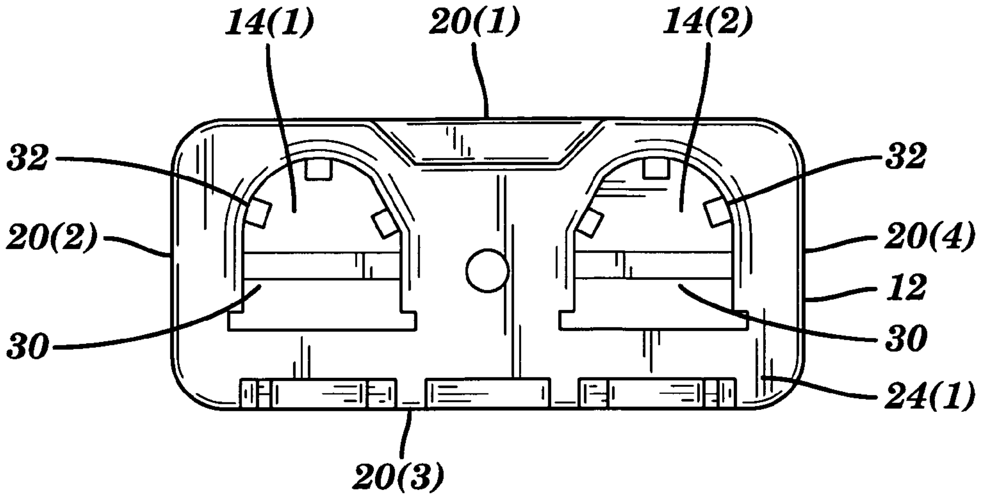
FIG. 6 is a back view of the first embodiment of the finger proof, keyed power connector.

Referring to FIGS. 1 and 6, a pair of connector passages 14(1) and 14(2) are formed to extend in one end 24(1) of the housing 12, although other numbers of passages and other can be used. Each of the connector passages 14(1) and 14(2) is shaped to receive a connector, such as a power cable, line, or wire. Each of the connector passages 14(1) and 14(2) has an outer perimeter or periphery with a flat base 30 which is connected at each end to the ends of a semi-circle portion 32, although the outer periphery of the connector passages 14(1) and 14(2) could have other shapes.

Referring to FIGS. 1–7, the pair of interface passages 18(1) and 18(2) extend into another end 24(2) of the housing 12, although the housing 12 could have other numbers of interface passages, such as one or three or more interface passages. The connector passage 14(1) connects to the interface passage 18(1) to form a through passage from one end 24(1) to the other end 24(2) of the housing 12, although other arrangements for the passages could be used. Similarly, the connector passage 14(2) connects to the interface passage 18(2) to form another through passage from one end 24(1) to the other end 24(2) of the housing 12, although other arrangements for these passages could be used. The pair of mating interfaces 19(1) and 19(2) are adjacent the interface passages 18(1) and 18(2).

Figure 7:
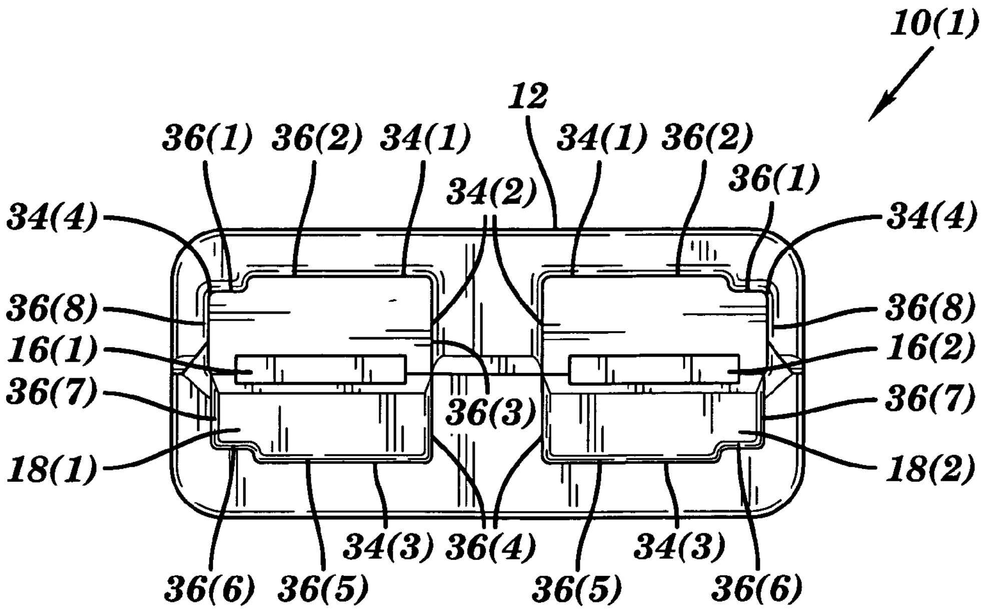
FIG. 7 is a front view of the first embodiment of the finger proof, keyed power connector.

Referring to FIG. 7, a genderless, flat wiping, electrical contact 16(1) is located in the interface passage 18(1) and extends into the connector passage 14(1) and another genderless, flat wiping, electrical contact 16(2) is located in the interface passage 18(2) and extends into the connector passage 14(2), although other types of electrical contacts and other configurations can be used. Electrical contact 16(1) is secured to and biased by a spring in interface passage 18(1) to provide the necessary normal force for engaging and coupling to a connector, such as power cable, wire, or lead to a component, which can mate with the interface passage 18(1), although other manners for securing a connector in the interface passage 18(1) could be used. Similarly, electrical contact 16(2) is secured to and biased by a spring in interface passage 18(2) to provide the necessary normal force for engaging and coupling to another connector, such as power cable, wire, or lead to a component, which can mate with the interface passage 18(2), although other manners for securing a connector in the mating interface passage 18(2) also could be used. Although genderless, flat wiping, electrical contacts 16(1) and 16(2) are shown, other numbers, types, and arrangements of electrical contacts can be used, such as a male-female contact arrangement The openings to the interface passages 18(1) and 18(2) are sized to create finger proof barriers, i.e. smaller than the outer dimensions of the fingers of an individual, to prevent an operator's fingers from accidentally touching either of the energized contacts 16(1) and 16(2). Additionally, the electrical contacts 16(1) and 16(2) are located inside and spaced from an opening to each of the interface passages 18(1) and 18(2) to also prevent an operator from accidentally contacting either of the energized contacts 16(1) and 16(2).

Each of the interface passages 18(1) and 18(2) has a generally square configuration, although the interface passages could have other shapes and configurations for the outer perimeter. The interface passage 18(1) and the mating interface 19(1) has sections 34(1)–34(4) and the interface passage 18(2) and the mating interface 19(2) has sections 36(1)–36(4), although the interface passage 18(1) and mating interface 19(1), and interface passage 18(2) and mating interface 19(2) could have other numbers and types of sections.

With respect to interface passage 18(1) and mating interface 19(1), the section 34(1) has an indented portion 36(1) adjacent a substantially straight portion 36(2). The section 34(2) has a substantially straight portion 36(3) between substantially straight portion 36(2) and indented portion 36(4). The section 34(3) has a substantially straight portion 36(5) between the indented portion 36(4) and the indented portion 36(6). The section 34(4) has a substantially straight portion 36(7) between the indented portion 36(6) and a protruded portion 36(8).

The interface passage 18(2) with the mating interface 19(2) is a mirror image of the interface passage 18(1) with the mating interface 19(1) with the same number and types of sections and portions as described with reference to interface passage 18(1) and mating interface 19(1), although the interface passage 18(1) and mating interface 19(1), and interface passage 18(2) and mating interface 19(1) could have different or identical configurations.

Figure 8:
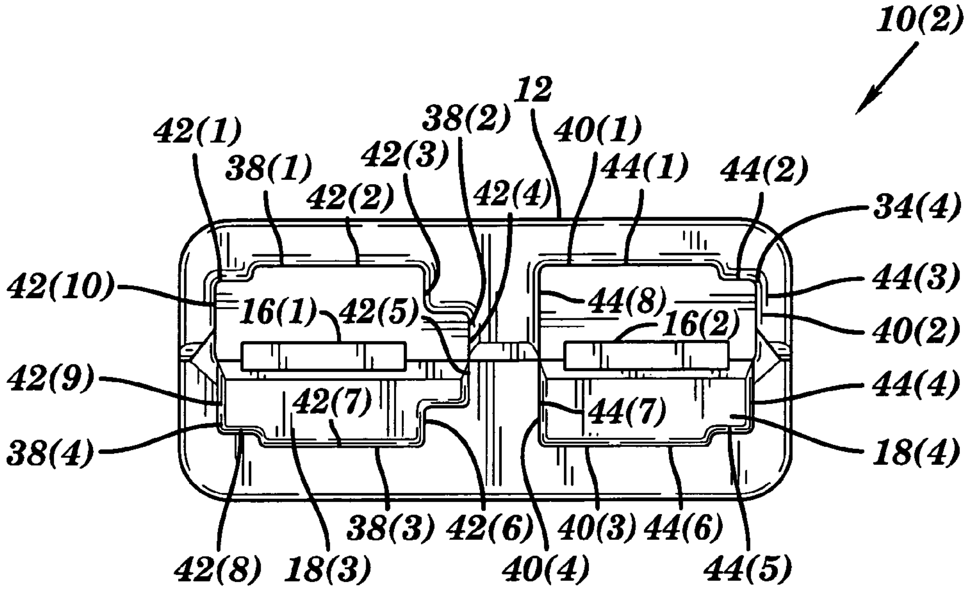
FIG. 8 is a front view of a second embodiment of the interface passages for a finger proof, keyed power connector.

Referring to FIG. 8, a finger proof, keyed power connector 10(2) with interface passages 18(3) and 18(4) and mating interfaces 19(3) and 19(4) in accordance with other embodiments of the present invention is illustrated. Finger proof, keyed power connector 10(2) is identical to the finger proof, keyed power connector 10(1), except as described below with respect to the interface passages 18(3) and 18(4) and mating interfaces 19(3) and 19(4).

Each of the interface passages 18(3) and 18(4) has a generally square configuration, although the interface passages could have other shapes and configurations for the outer perimeter. The interface passage 18(3) and the mating interfaces 19(3) has sections 3 8(1)–38(4) and the interface passage 18(4) and the mating interfaces 19(4) has sections 40(1)–40(4), although the interface passage 18(3) and mating interface 19(3), and interface passage 18(4) and mating interface 19(4) each could have other numbers and types of sections with other numbers and types of portions in other configurations.

With respect to interface passage 18(3) and mating interface 19(3), the section 38(1) has an indented portion 42(1) adjacent a substantially straight portion 42(2). The section 38(2) has an indented portion 42(3) between the substantially straight portion 42(2) and a protruded portion 42(4) and also has a substantially straight portion 42(5) between the protruded portion 42(4) and an indented portion 42(6). The section 38(3) has a substantially straight portion 42(7) between the indented portion 42(6) and an indented portion 42(8). The section 38(4) has substantially straight portion 42(9) between the indented portion 42(8) and a protruded portion 42(10).

With respect to interface passage 18(4) and mating interface 19(4), the section 40(1) has a substantially straight portion 44(1) adjacent an indented portion 44(2). The section 40(2) has a protruded portion 44(3) between the indented portion 44(2) and a substantially straight portion 44(4). The section 40(3) has an indented portion 44(5) between the substantially straight portion 44(4) and the substantially straight portion 44(6). The section 40(4) has an indented portion 44(7) between the substantially straight portion 44(6) and a substantially straight portion 44(8

Figure 9:
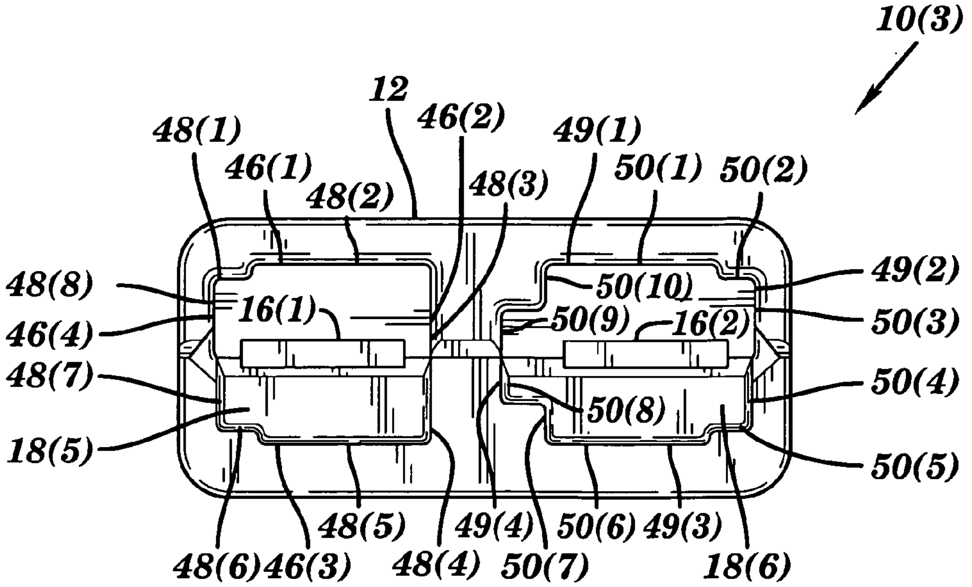
FIG. 9 is a front view of a third embodiment of the interface passages for a finger proof, keyed power connector.

Referring to FIG. 9, a finger proof, keyed power connector 10(3) with interface passages 18(5) and 18(6) and mating interfaces 19(5) and 19(6) in accordance with other embodiments of the present invention is illustrated. Finger proof, keyed power connector 10(3) is identical to the finger proof, keyed power connector 10(1), except as described below with respect to the interface passages 18(5) and 18(6) and mating interfaces 19(5) and 19(6).

Each of the interface passages 18(5) and 18(6) has a generally square configuration, although the interface passages could have other shapes and configurations for the outer perimeter. The interface passage 18(5) and mating interface 19(5) has sections 46(1 )–46(4) and the interface passage 18(6) and mating interface 19(6) has sections 49(1) –49(4), although the interface passage 18(5) and mating interface 19(5), and interface passage 18(6) and mating interface 19(6) each could have other numbers and types of sections with other numbers and types of portions in other configurations.

With respect to interface passage 18(5) and mating interface 19(5), the section 46(1) has an indented portion 48(1) adjacent a substantially straight portion 48(2). The section 46(2) has a substantially straight portion 48(3) between substantially straight portion 48(2) and indented portion 48(4). The section 46(3) has a substantially straight portion 48(5) between the indented portion 48(4) and the indented portion 48(6). The section 46(4) has a substantially straight portion 48(7) between the indented portion 46(6) and a protruded portion 46(8).

With respect to interface passage 18(6) and mating interface 19(6), the section 49(1) has a substantially straight portion 50(1) adjacent an indented portion 50(2). The section 49(2) has a protruding portion 50(3) between the indented portion 50(2) and a substantially straight portion 50(4). The section 49(3) has an indented portion 50(5) between the substantially straight portion 50(6) and the substantially straight portion 50(7). The section 49(4) has an indented portion 50(7) between the substantially straight portion 50(6) and the substantially straight portion 50(8). The section 49(4) also has a protruding portion 50(9) between the substantially straight portion 50(8) and an indented portion 50(10).

Figure 10:
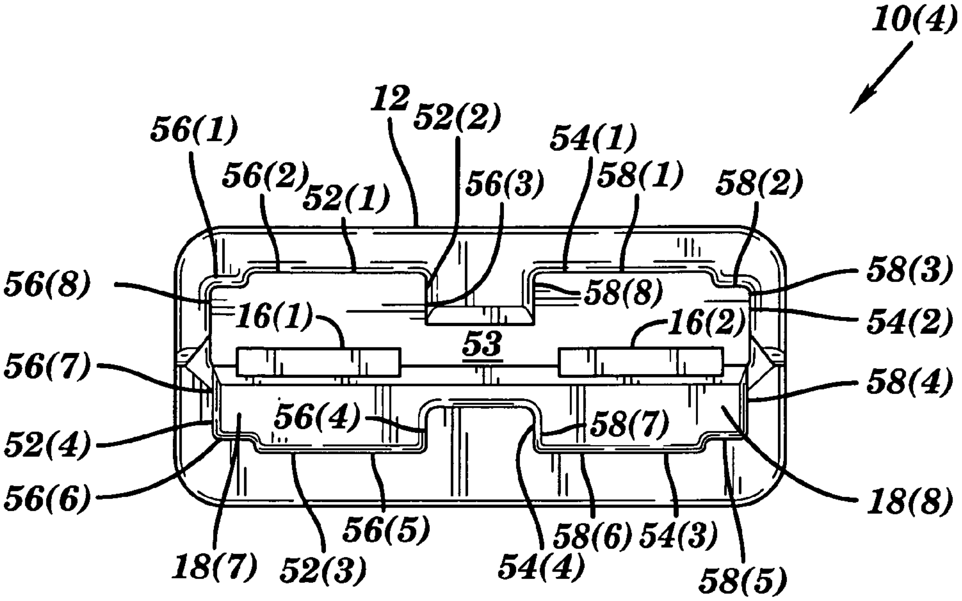
FIG. 10 is a front view of a fourth embodiment of the interface passages for a finger proof, keyed power connector.

Referring to FIG. 10, a finger proof, keyed power connector 10(4) with interface passages 18(7) and 18(8) and mating interfaces 19(7) and 19(8) in accordance with other embodiments of the present invention is illustrated. Finger proof, keyed power connector 10(4) is identical to the finger proof, keyed power connector 10(1), except as described below with respect to the interface passages 18(7) and 18(8) and mating interfaces 19(3) and 19(4).

Each of the interface passages 18(7) and 18(8) has a generally square configuration, although the interface passages could have other shapes and configurations for the outer perimeter. The interface passage 18(7) and mating interface 19(7) has sections 52(1)–52(4) and the interface passage 18(8) and mating interface 19(7) has sections 54(1)–54(4), although the interface passage 18(7) and mating interface 19(7), and interface passage 18(8) and mating interface 19(8) each could have other numbers and types of sections with other numbers and types of portions in other configurations.

With respect to interface passage 18(7) and mating interface 19(7), the section 52(1) has an indented portion 56(1) adjacent a substantially straight portion 56(2). The section 52(2) has substantially straight portions 56(3) and 56(4) which are separated by an intermediary passage 53 which connects interface passages 18(7) and 18(8). The section 52(3) has a substantially straight portion 56(5) between the substantially straight portion 56(4) and an indented portion 56(6). The section 52(4) has substantially straight portion 56(7) between the indented portion 56(6) and a protruded portion 56(8).

With respect to interface passage 18(8) and mating interface 19(8), the interface passage 18(8) is a mirror image of the interface passage 18(7). More specifically, section 54(1) with portions 58(1)–58(2) is a mirror image of section 52(1) with portions 56(1)–56(2). The section 54(2) with portions 58(3)–58(4) is a mirror image of section 52(4) with portions 56(7)–56(8). The section 54(3) with portions 58(5)–58(6) is a mirror image of section 52(3) with portions 56(5) and 56(6). The section 54(4) with portions 58(7)–58(8) is a mirror image of section 52(2) with portions 56(3)–56(4).

Figure 11:
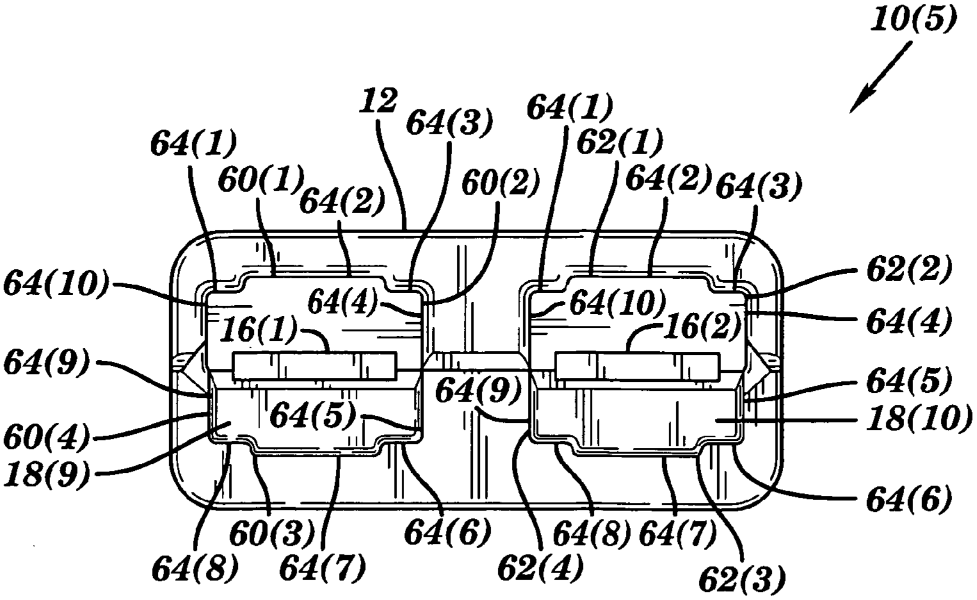
FIG. 11 is a front view of a fifth embodiment of the interface passages for a finger proof, keyed power connector.

Referring to FIG. 11 a finger proof, keyed power connector 10(5) with interface passages 18(9) and 18(10) and mating interfaces 19(9) and 19(10) in accordance with other embodiments of the present invention is illustrated. Finger proof, keyed power connector 10(5) is identical to the finger proof, keyed power connector 10(1), except as described below with respect to the interface passages 18(9) and 18(10) and mating interfaces 19(9) and 19(10).

Each of the interface passages 18(9) and 18(10) has a generally square configuration, although the interface passages could have other shapes and configurations for the outer perimeter. The interface passage 18(9) and mating interface 19(9) has sections 60(1)–60(4) and the interface passage 18(10) and mating interface 19(10) has sections 62(1)–62(4), although the interface passage 18(9) and mating interface 19(9), and interface passage 18(10) and mating interface 19(10) each could have other numbers and types of sections with other numbers and types of portions in other configurations.

With respect to interface passage 18(9) and mating interface 19(9), the section 60(1) has a substantially straight portion 64(2) between indented portions 64(1) and 64(3). The section 60(2) has a protruded portion 64(4) between indented portion 64(3) and substantially straight portion 64(5). The section 60(3) a substantially straight portion 64(7) between indented portions 64(6) and 64(8) and the indented portion 64(6) is also adjacent substantially straight portion 64(5). The section 60(4) has a substantially straight portion 64(9) between the indented portion 64(8) and the protruded portion 64(10).

The interface passage 18(10) with mating interface 19(10) is identical to interface passage 18(9) with mating interface 19(9). More specifically, section 62(1) is the same as section 60(1), section 62(2) is the same as section 60(2), section 62(3) is the same as section 60(3), and section 62(4) is the same as section 60(4).

Figure 12:
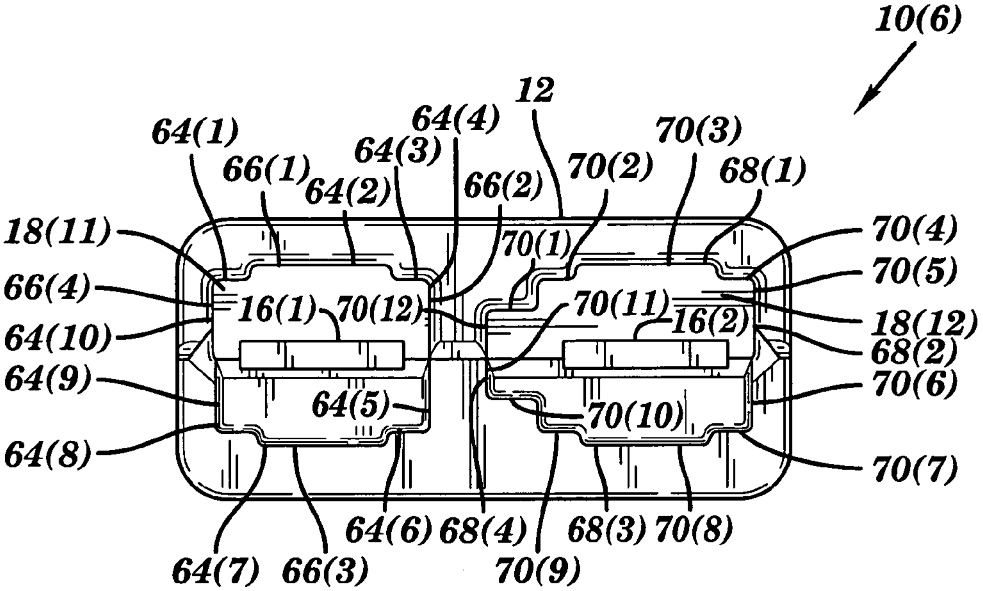
FIG. 12 is a front view of a sixth embodiment of the interface passages for a finger proof, keyed power connector.

Referring to FIG. 12, a finger proof, keyed power connector 10(6) with interface passages 18(11) and 18(12) and mating interfaces 19(11) and 19(12) in accordance with other embodiments of the present invention is illustrated. Finger proof, keyed power connector 10(6) is identical to the finger proof, keyed power connector 10(1), except as described below with respect to the interface passages 18(11) and 18(12) and mating interfaces 19(11) and 19(12).

Each of the interface passages 18(11) and 18(12) has a generally square configuration, although the interface passages could have other shapes and configurations for the outer perimeter. The interface passage 18(11) and mating interface 19(11) has sections 66(1)–66(4) and the interface passage 18(12) and mating interface 19(12) has sections 68(1)–68(4), although the interface passage 18(11) and mating interface 19(11), and interface passage 18(12) and mating interface 19(12) each could have other numbers and types of sections with other numbers and types of portions in other configurations.

The interface passage 18(11) with mating interface 19(11) is identical to interface passage 18(9) with mating interface 19(9) described earlier with reference to FIG. 9. More specifically, section 66(1) is the same as section 60(1), section 66(2) is the same as section 60(2), section 66(3) is the same as section 60(3), and section 66(4) is the same as section 60(4).

With respect to interface passage 18(12) and mating interface 19(12), the section 68(1) has an indented section 70(1) adjacent another less indented portion 70(2). The section 68(1) also has a substantially straight portion 70(3) which is between the indented portion 70(2) and an indented portion 70(4). The section 68(2) has a protruded portion 70(5) between the indented portion 70(4) and substantially straight portion 70(6). The section 68(3) a substantially straight portion 70(8) between indented portions 70(7) and 70(9). The section 68(3) also has another indented portion 70(10) adjacent the indented portion 70(9).

The section 68(4) has a substantially straight portion 70(11) between the indented portion 70(10) and a protruded portion 70(12).

Figure 13:
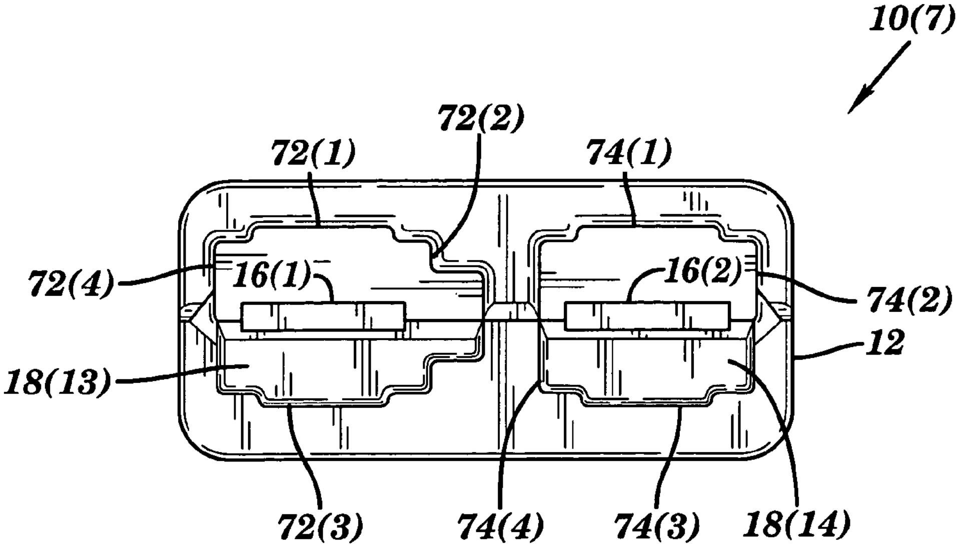
FIG. 13 is a front view of a seventh embodiment of the interface passages for a finger proof, keyed power connector.

Referring to FIG. 13, a finger proof, keyed power connector 10(7) with interface passages 18(13) and 18(14) and mating interfaces 19(13) and 19(14) in accordance with other embodiments of the present invention is illustrated. Finger proof, keyed power connector 10(7) is identical to the finger proof, keyed power connector 10(1), except as described below with respect to the interface passages 18(13) and 18(14) and mating interfaces 19(13) and 19(14).

Each of the interface passages 18(13) and 18(14) has a generally square configuration, although the interface passages could have other shapes and configurations for the outer perimeter. The interface passage 18(13) and mating interface 19(13) has sections 72(1)–72(4) and the interface passage 18(14) and mating interface 19(14) has sections 74(1)–74(4), although the interface passage 18(13) and mating interface 19(13), and interface passage 18(14) and mating interface 19(14) each could have other numbers and types of sections with other numbers and types of portions in other configurations.

The interface passage 18(13) is a mirror image of the interface passage 18(12) with the same number and types of sections and portions as described earlier with reference to FIG. 12. More specifically, section 72(1) is a mirror image of section 68(1), section 72(2) is a mirror image of section 68(4), section 72(3) is a mirror image of to section 68(3), and section 72(4) is a mirror image of section 68(2).

The interface passage 18(14) and mating interface 19(14) is identical to interface passage 18(9) and mating interface 19(9). More specifically, section 74(1) is the same as section 60(1), section 74(2) is the same as section 60(2), section 74(3) is the same as section 60(3), and section 74(4) is the same as section 60(4).

Figure 14:
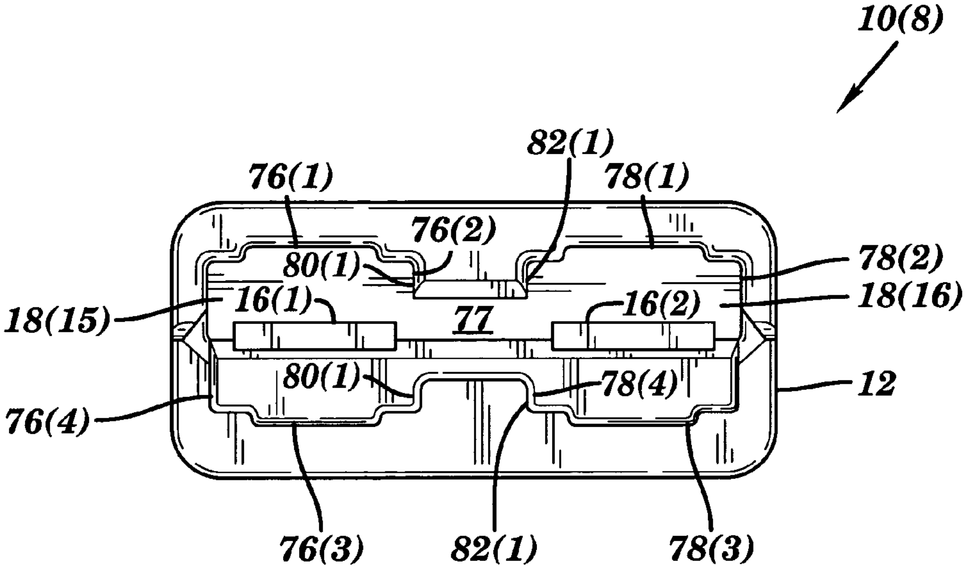
FIG. 14 is a front view of a eighth embodiment of the interface passages for a finger proof, keyed power connector.
Figure 1:
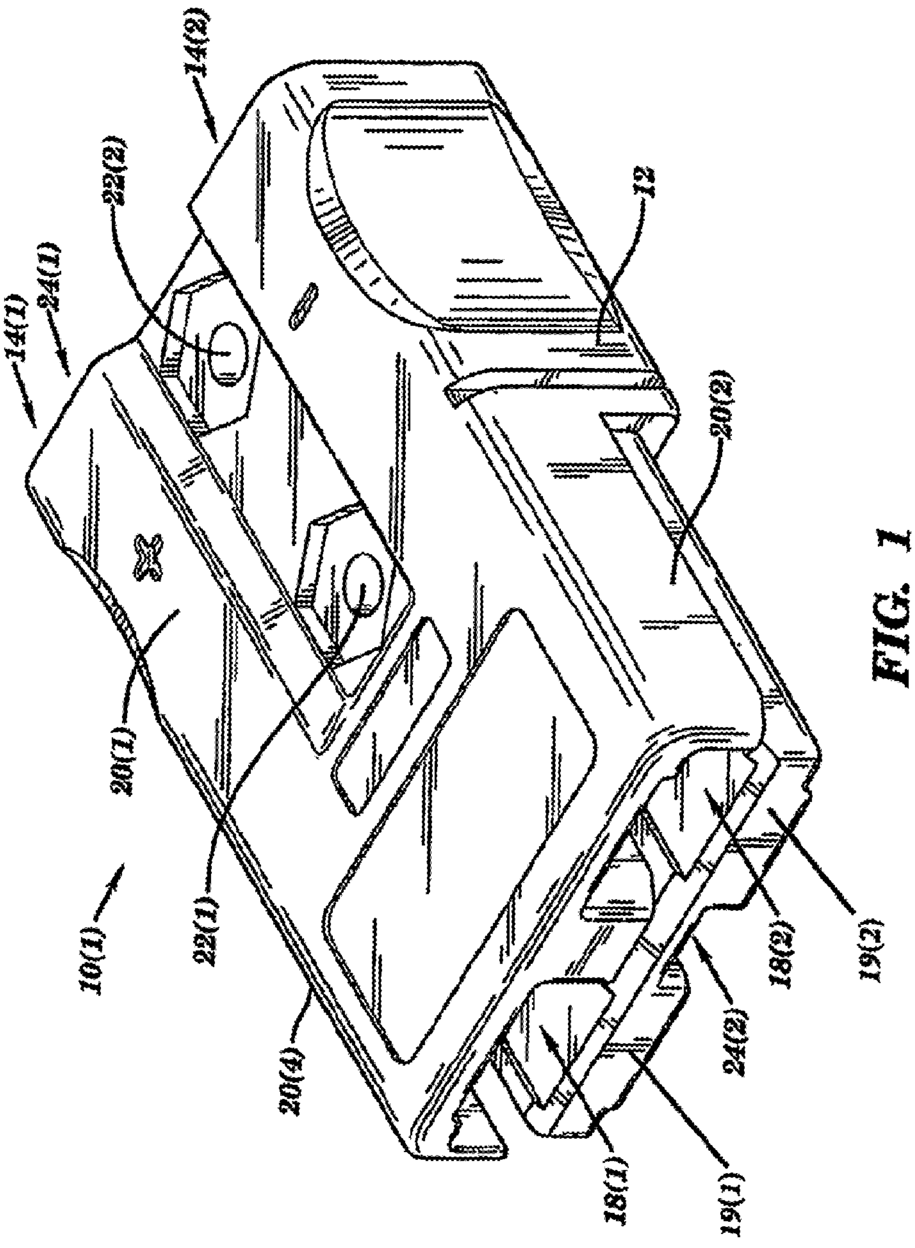
Figure 2:
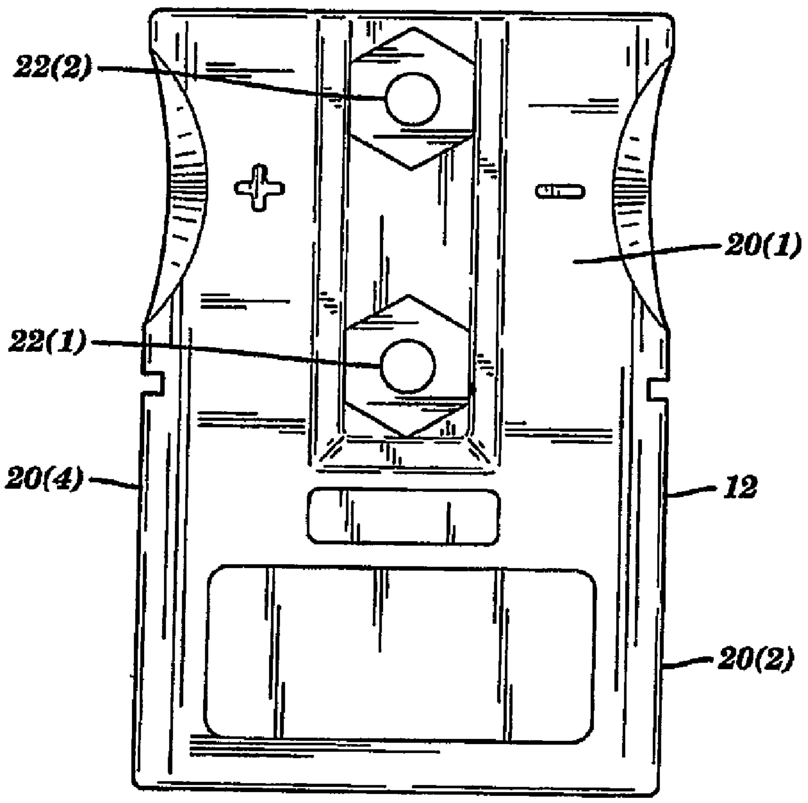
Figure 3:
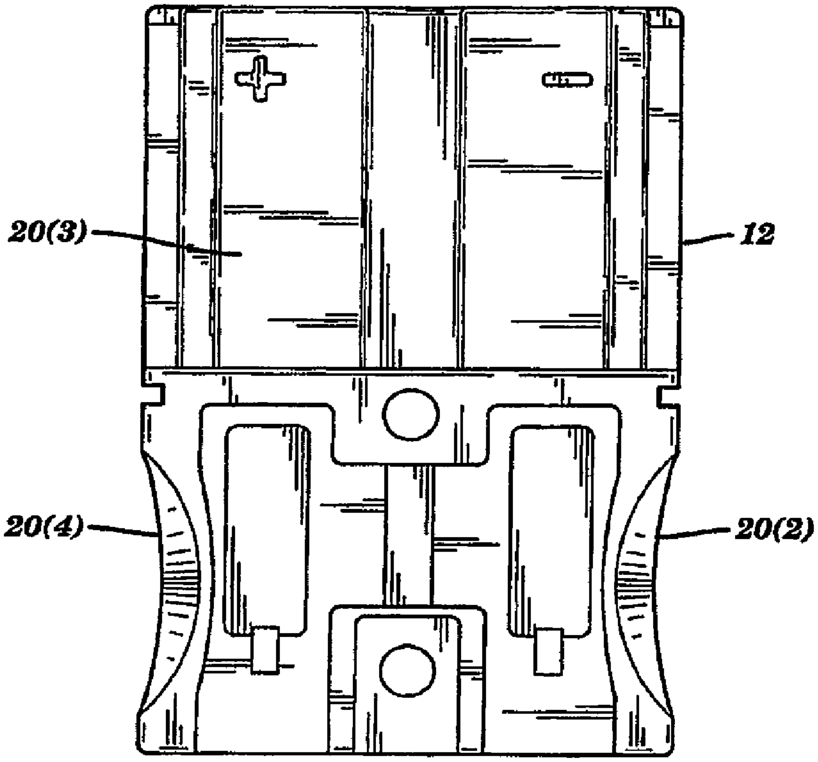
Figure 4:
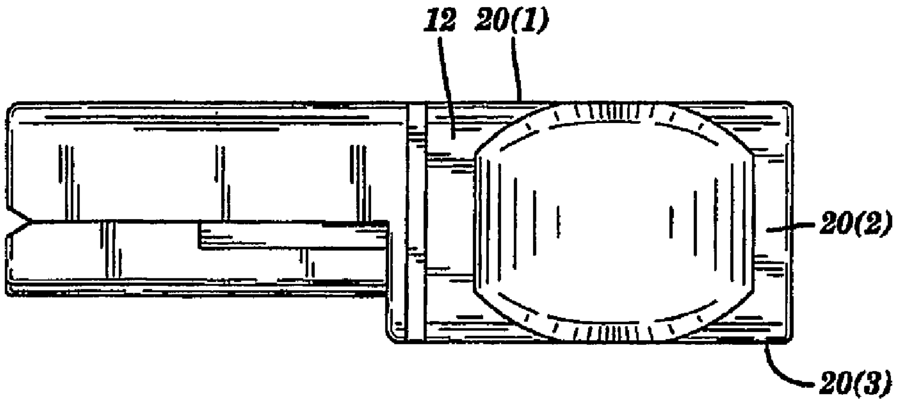
Figure 5:
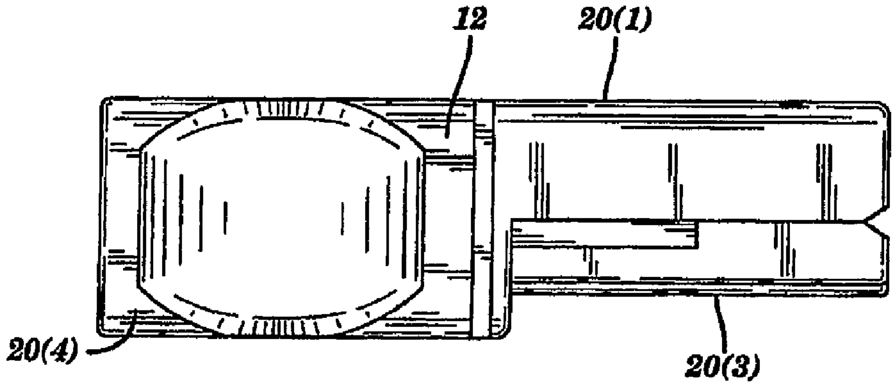
Figure 6:
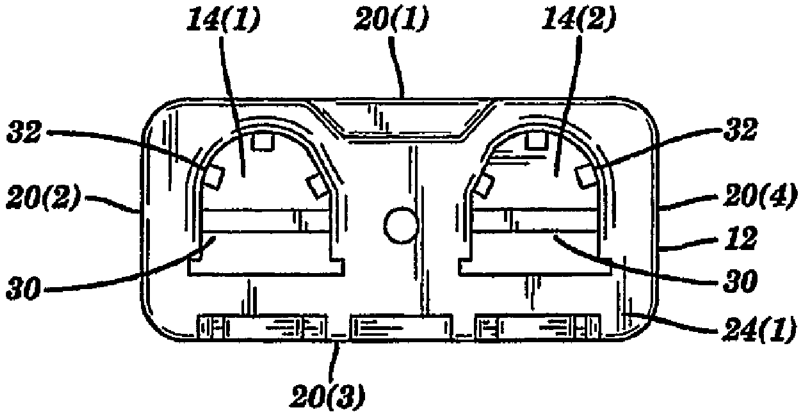
Figure 7:
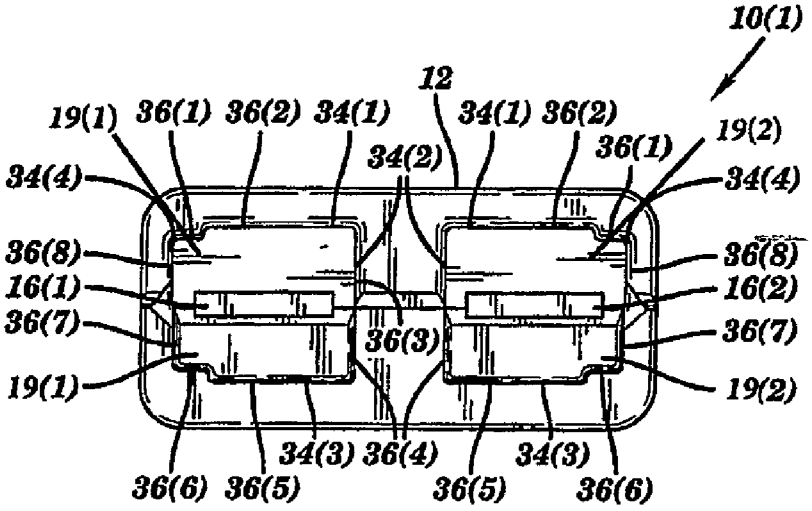
Figure 8:
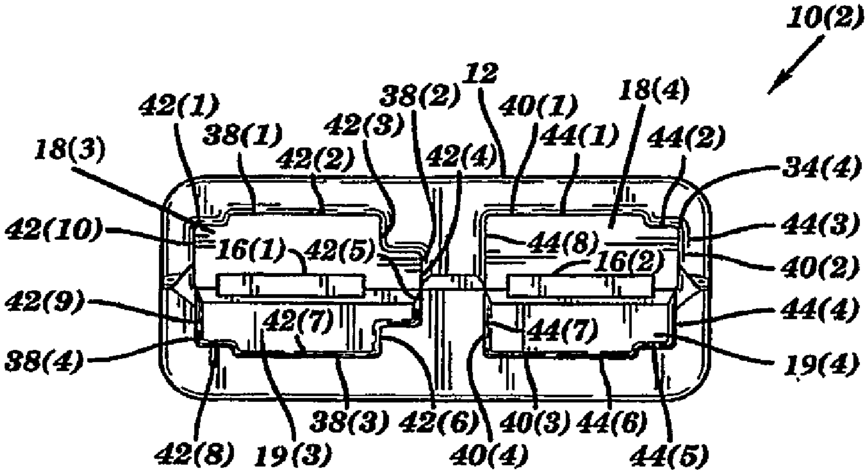
Figure 9:
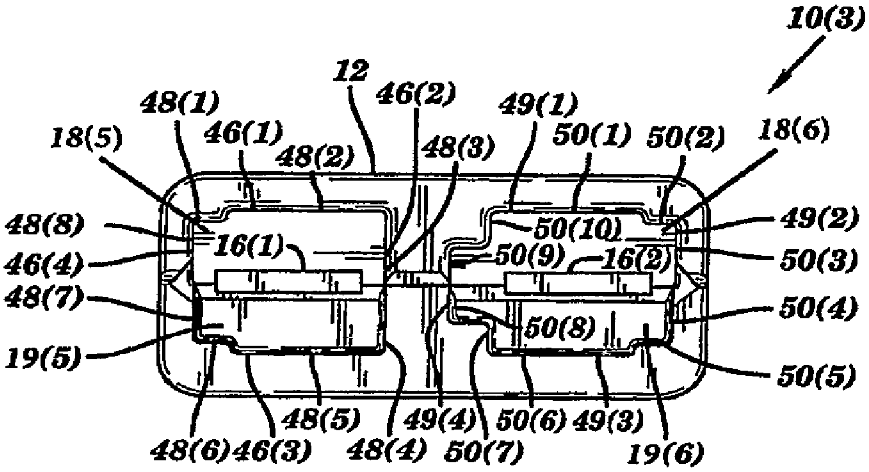
Figure 10:
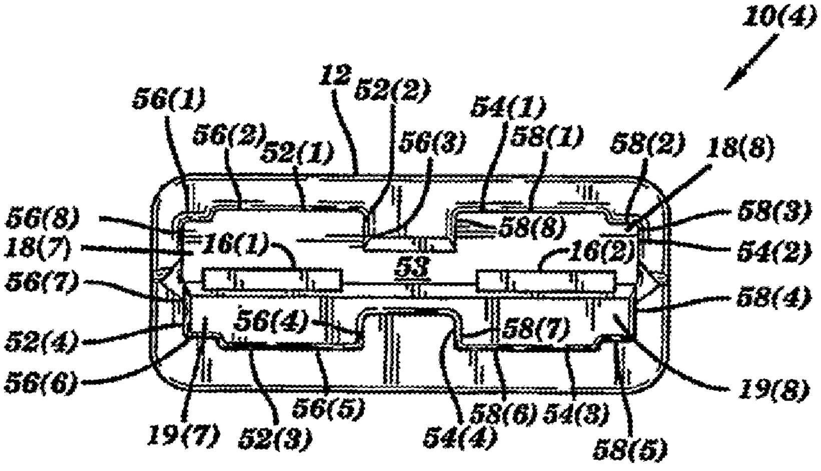
Figure 11:
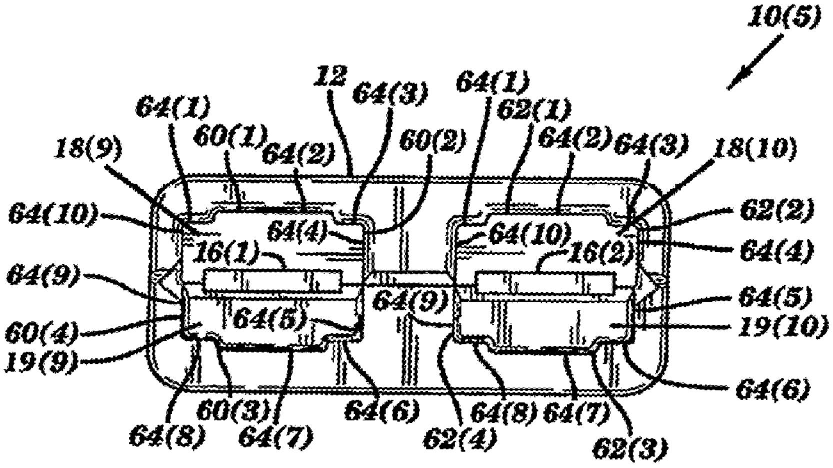
Figure 12:
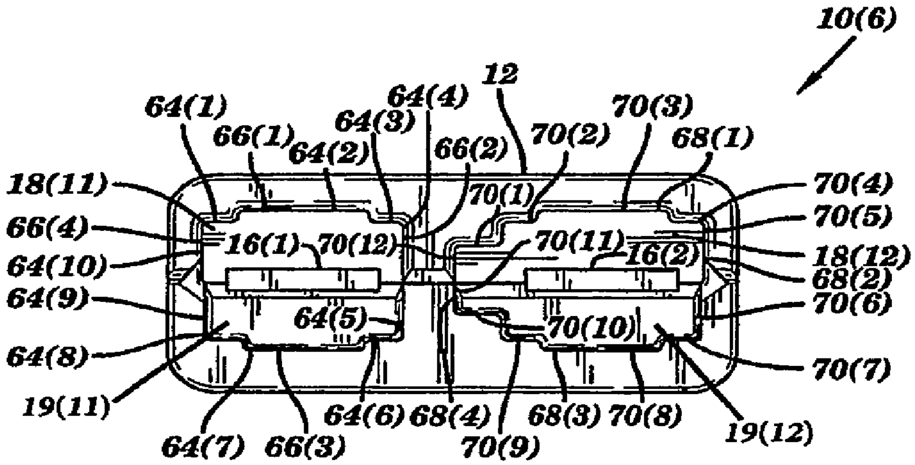
Figure 13:
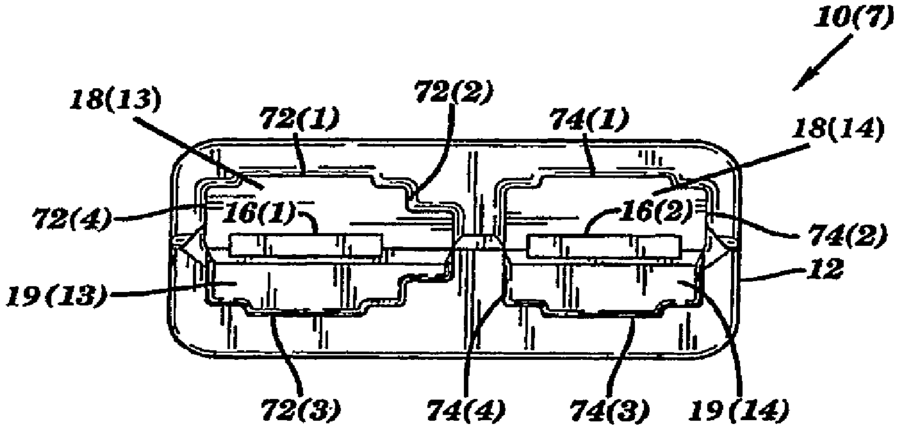
Figure 14:
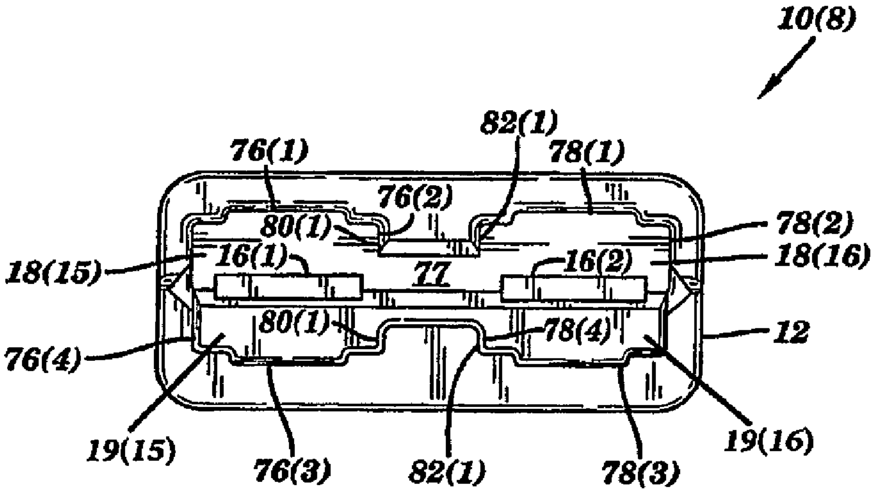

Referring to FIG. 14, a finger proof, keyed power connector 10(8) with interface passages 18(15) and 18(16) and mating interfaces 19(15) and 19(16) in accordance with other embodiments of the present invention is illustrated. Finger proof, keyed power connector 10(8) is identical to the finger proof, keyed power connector 10(1), except as described below with respect to the interface passages 18(15) and 18(16) and mating interfaces 19(15) and 19(16).

Each of the interface passages 18(15) and 18(16) has a generally square configuration, although the interface passages could have other shapes and configurations for the outer perimeter. The interface passage 18(15) and mating interface 19(15) has sections 76(1)–76(4) and the interface passage 18(16) and mating interface 19(16) has sections 78(1)–78(4), although the interface passage 18(15) and mating interface 19(15), and interface passage 18(16) and mating interface 19(16) each could have other numbers and types of sections with other numbers and types of portions in other configurations.

The interface passage 18(15) and mating interface 19(15) is identical to the interface passage 18(9) and mating interface 19(9) described earlier with reference to FIG. 11 with sections 76(1), 76(3), and 76(4) corresponding to sections 60(1), 60(3), and 60(4), except that section 76(2) is different from section 60(2). The section 76(2) has a substantially straight portion 80(1) that is separated by an intermediary passage 77 which connects interface passages 18(15) and 18(16).

The interface passage 18(16) and mating interface 19(6) also is identical to the interface passage 18(9) and mating interface 19(9) described earlier with reference to FIG. 11 with sections 78(1)–78(3) corresponding to sections 60(l)–60(3), except that section 78(4) is different from section 60(4). The section 78(4) has a substantially straight portion 82(1) that is separated by the intermediary passage 77 which connects interface passages 18(15) and 18(16).

As the above described exemplary embodiments have illustrated, a variety of different combinations of shapes for the outer perimeter or periphery of the interface passages 18(1)–18(16) and mating interfaces 19(1)–19(16). With these keyed configurations for the outer perimeter of the interface passages, a system can be built which will assure the proper connection of a particular power source to a particular component.

Additional configurations within the passages can be used for additional keying combinations, thus multiplying the mating combinations for additional voltage, circuit, or specific application versions.

Referring to FIGS. 1–7, the operation of the finger proof, keyed power connector 10(1) will be described. When input connectors from a power supply need to be connected to a system, the input connectors have a particular shape which can only mate and connect with interface passages with a particular outer perimeter. In this particular embodiment, if the shape of the input connectors mates with the shape of the outer perimeter of the interface passages 18(1) and 18(2), then the input connectors are coupled via the electrical contacts 16(1) and 16(2), respectively, to connectors in the connector passages 14(1) and 14(2) which are coupled to a power source.

If the input connectors do not have the same configuration as the configuration of the outer perimeter of the interface passages 18(1) and 18(2), then the input connectors can not be mated into the interface passages 18(1) and 18(2) and thus can not be coupled to the electrical contacts 16(1) and 16(2). As a result, damage to the system caused by an incorrectly coupled power supply can be avoided.

With the present invention, the electrical contacts 16(1) and 16(2) are spaced within and away from the openings to the interface passages 18(1) and 18(2) and the dimensions of the interface passages 18(1) and 18(2) are sized to be finger proof to prevent accidental contact by an operator.

Since the operation of the finger proof, keyed power connectors 10(2)–10(8) is identical to the operation of the finger proof, keyed power connector 10(1), except that different input connectors will be able to mate with different interface passages 18(3)–18(16) and will be prevented from mating with other interface passages 18(3)–18(6) depending on the particular configurations of the input connectors and the interface passages 18(3)–18(16), the operation of finger proof, keyed power connectors 10(2)–10(8) will not be described.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto

What is claimed is:

1. A connector comprising:

a housing;

one or more interface passages formed in the housing, each of the interface passages having an outer perimeter, wherein multiple portions of the outer perimeter are spaced in or spaced out from a portion of the outer perimeter adjacent each of the multiple portions;

one or more mating interfaces adjacent the one or more interface passages, wherein each of the mating interfaces has an outer perimeter which has substantially the same shape as the outer perimeter of the adjacent one of the interface passages;

one or more connector passages formed in the housing, each of the connector passages is connected to one of the interface passages; and an electrical contact is seated in each of the one or more interface passages, is spaced from an opening to each of the interface passages, and extends in to the connector passage, wherein the electrical contact is spaced in from an opening to the interface passage at a distance to prevent accidentally an electrical connection between the electrical contact and a conductor at the opening to the interface passage.

2. The connector as set forth in claim 1 wherein each of the interface passages is sized to create a finger proof barrier.

3. The connector as set forth in claim 1 wherein a portion of the interface passage spaced in from an opening to the interface passage has a keying configuration which differs from a keying configuration of the interface passage at the opening, wherein the interface passage is continuous.

4. The connector as set forth in claim 3 wherein at least one portion of an outer perimeter of the first configuration is spaced in or spaced out from at least one adjacent portion of the outer perimeter of the first configuration for the portion of the interface passage.

5. The connector as set forth in claim 1 further comprising at least two of the interface passages.

6. The connector as set forth in claim 5 wherein the outer perimeters of the at least two of the interface passages are substantially identical to each other.

7. The connector as set forth in claim 5 wherein a portion of each of the at least two interface passages spaced in from an opening to each of the interface passages has a keying configuration which differs from a keying configuration of each of the interface passages at the opening, wherein each of the interface passage is continuous.

8. The connector as set forth in claim 5 wherein the outer perimeters of the at least two of the interface passages are substantially mirror images of each other.

9. The connector as set forth in claim 8 wherein an intermediary passage connects the at least two of the interface passages.

10. The connector as set forth in claim 5 wherein the outer perimeters of the at least two of the interface passages are different each other.

11. The connector as set forth in claim 10 wherein an intermediary passage connects the at least two of the interface passages.

12. A method for making a connector system, the method comprising:

forming one or more interface passages in a housing, each of the interface passages having an outer perimeter, wherein multiple portions of the outer perimeter are spaced in or spaced out from a portion of the outer perimeter adjacent each of the multiple portions;

forming one or more mating interfaces adjacent the one or more interface passages, wherein each of the mating interfaces has an outer perimeter which has substantially the same shape as the outer perimeter of the adjacent one of the interface passages;

forming one or more connector passages in the housing, each of the connector passages is connected to one of the interface passages; and providing an electrical contact in each of the one or more interface passages, the electrical contact is spaced from an opening to each of the interface passages and extends in to the connector passage, wherein the electrical contact is spaced in from an opening to the interface passage at a distance to prevent accidentally an electrical connection between the electrical contact and a conductor at the opening to the interface passage.

13. The method as set forth in claim 12 wherein each of the interface passages is sized to create a finger proof barrier.

14. The method as set forth in claim 12 wherein forming one or more interface passages further comprises forming a portion of the interface passage spaced in from an opening to the interface passage to have a keying configuration which differs from a keying configuration of the interface passage at the opening, wherein the interface passage is continuous.

15. The method as set forth in claim 12 wherein at least one portion of an outer perimeter of the first configuration is spaced in or spaced out from at least one adjacent portion of the outer perimeter of the first configuration for the portion of the interface passage.

16. The method as set forth in claim 12 wherein a portion of each of the at least two interface passages spaced in from an opening to each of the interface passages has a keying configuration which differs from a keying configuration of each of the interface passages at the opening, wherein each of the interface passage is continuous.

17. The method as set forth in claim 12 wherein forming one or more interface passages further comprising forming at least two of the interface passages.

18. The method as set forth in claim 17 wherein the outer perimeters of the at least two of the interface passages are substantially identical to each other.

19. The method as set forth in claim 17 wherein the outer perimeters of the at least two of the interface passages are substantially mirror images of each other.

20. The method as set forth in claim 19 wherein an intermediary passage connects the at least two of the interface passages.

21. The method as set forth in claim 17 wherein the outer perimeters of the at least two of the interface passages are different each other.

22. The method as set forth in claim 21 wherein an intermediary passage connects the at least two of the interface passages.

* * * * *

UNITED STATES PATENT AND TRADEMARK OFFICE

CERTIFICATE OF CORRECTION

PATENT NO. : 6,994,595 B2 
APPLICATION NO. : 10/723615
DATED : February 7, 2006
INVENTOR(S) : Baker et al.

It is certified that error appears in the above-identified patent and that said Letters Patent is hereby corrected as shown below:

Column 1, line 11 - “connector” should have period after it

Column 1, line 37 - “in to” should be --into--

Column 1, line 48 - “in to” should be --into--

Column 4, line 24 - “interfaces” should be --interface--

Column 4, line 24 - “3 8 (1)” should be --38(1)--

Column 4, line 25 - “interfaces” should be --interface--

Column 4, line 52 - “44(8” should be --44(8)--

Column 4, line 65 - “46(1 )” should be --46(1)--

Column 9, line 5 - “thereto” should have a period after it

Delete Figures 1-9 - Insert following drawings 1-9

Title page with illustrative Figure should be deleted and substituted with attached title page.

Drawing sheets, consisting of Fig. 1-9, should be deleted and replaced with drawing sheets consisting of Fig. 1-9

Signed and Sealed this

Thirtieth Day of January, 2007

JON W. DUDAS
*Director of the United States Patent and Trademark Office*

(12) United States Patent
Baker et al.

(10) Patent No.: US 6,994,595 B2
(45) Date of Patent: Feb. 7, 2006

(54) FINGER PROOF, KEYED POWER CONNECTOR AND METHODS THEREOF

(75) Inventors: Craig Baker, Shrewsbury, MA (US); Andre Beaupre, Barre, MA (US); Greg Norton, Marlboro, MA (US); Joe Belrose, Blackstone, MA (US)

(73) Assignee: Anderson Power Products, Sterling, MA (US)

( * ) Notice: Subject to any disclaimer, the term of this patent is extended or adjusted under 35 U.S.C. 154(b) by 0 days.

(21) Appl. No.: 10/723,615

(22) Filed: Nov. 26, 2003

(65) Prior Publication Data

US 2004/0171309 A1 Sep. 2, 2004

Related U.S. Application Data

(60) Provisional application No. 60/429,977, filed on Nov. 27, 2002.

(51) Int. Cl.
*H01R 13/64* (2006.01)

(52) U.S. Cl. ........ 439/680

(58) Field of Classification Search ........ 439/680, 439/295, 284, 350, 171, 681, 247, 560

See application file for complete search history.

(56) References Cited

U.S. PATENT DOCUMENTS 3,654,586 A * 4/1972 Winkler ........ 439/295
4,695,112 A * 9/1987 Maston et al. ........ 439/350
4,915,641 A * 4/1990 Miskin et al. ........ 439/247
4,990,099 A * 2/1991 Marin et al. ........ 439/284
5,167,542 A * 12/1992 Haitmanek ........ 439/681
6,089,898 A * 7/2000 Lincoln et al. ........ 439/357
6,383,032 B1 * 5/2002 Gerberding ........ 439/681

* cited by examiner

*Primary Examiner*—Gary Paumen
*Assistant Examiner*—Phuongchi Nguyen
(74) *Attorney, Agent, or Firm*—Nixon Peabody LLP

(57) ABSTRACT

A finger proof, keyed connector includes a housing, one or more interface passages formed in the housing, one or more connector passages formed in the housing, and an electrical contact. Each of the interface passages has an outer perimeter where at least one portion of the outer perimeter is spaced in or spaced out from at least one adjacent portion of the outer perimeter. Each of the connector passages is connected to one of the interface passages. The electrical contact is seated in each of the one or more interface passages, is spaced from an opening to each of the interface passages, and extends in to the connector passage.

22 Claims, 9 Drawing Sheets

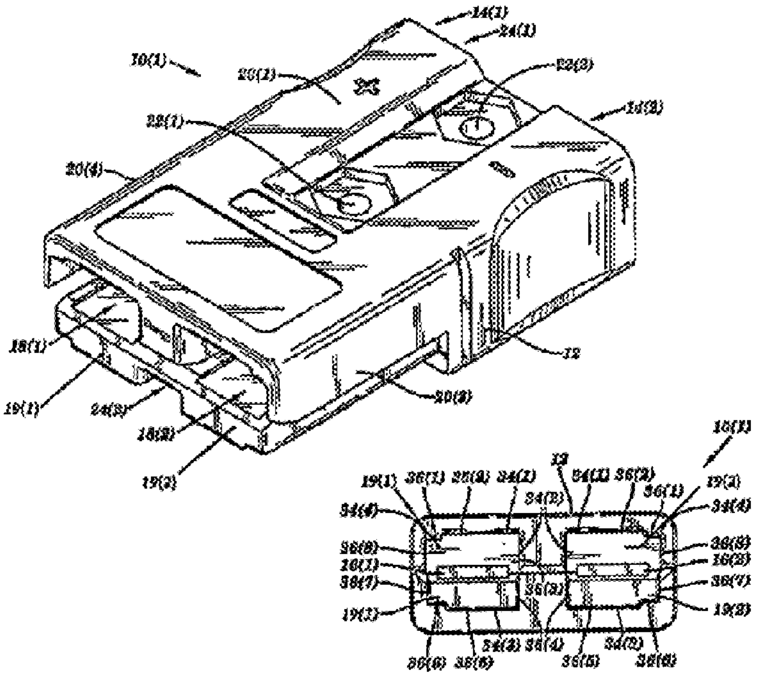

U.S. Patent Feb. 7, 2006 Sheet 1 of 9 6,994,595 B2